United States Patent [19]

Sterner

[11] 3,859,657

[45] Jan. 7, 1975

[54] SECOND HARMONIC FILTER FOR HIGH FREQUENCY SOURCE

[75] Inventor: Francis L. Sterner, Tempe, Ariz.

[73] Assignee: Omni Spectra, Inc., Farmington, Mich.

[22] Filed: Oct. 18, 1972

[21] Appl. No.: 298,635

[52] U.S. Cl.............. 343/5 PD, 331/96, 331/107 G, 331/107 R, 333/76

[51] Int. Cl............................. G01s 9/42, H03b 1/04

[58] Field of Search.............. 331/96, 107 R, 107 G; 343/5 P, 5 D; 333/76, 83, 70 S

[56] References Cited

UNITED STATES PATENTS

| | | | |
|---|---|---|---|
| 3,334,267 | 8/1967 | Plumridge | 331/96 |
| 3,394,373 | 7/1968 | Makrancy | 331/96 |
| 3,401,355 | 9/1968 | Kafitz | 331/107 G |
| 3,452,305 | 6/1969 | Hefni | 333/83 |
| 3,471,806 | 10/1969 | Whitehorn | 331/96 |
| 3,571,750 | 3/1971 | Carlson | 331/96 |
| 3,593,192 | 7/1971 | Nagano et al. | 331/107 G |
| 3,624,550 | 11/1971 | Vane | 331/96 |
| 3,624,555 | 11/1971 | Klein | 331/96 |
| 3,715,686 | 2/1973 | Perlman | 331/96 |

*Primary Examiner*—T. H. Tubbesing
*Assistant Examiner*—G. E. Montone
*Attorney, Agent, or Firm*—Harness, Dickey & Pierce

[57] ABSTRACT

A second harmonic filter for a doppler radar intrusion system or the like which includes a cavitiy with an elongated coupling port containing an active device for generating microwave energy which is radiated through the cavity through the coupling port. In one embodiment the second harmonic filter includes a dielectric sheet which bridges the coupling port and which supports a resonant tuning stab. The resonant tuning stub is positioned orthogonal to the elongated dimension of the coupling port and is spaced from the coupling port. The tuning stub forms a capacitor with the coupling port and is dimensioned so as to resonate at the second harmonic frequency to act as a band stop filter at that frequency. In a second embodiment, the elongated coupling port includes a pair of opposed projections positioned mid-way between the ends of the port to form a pair of inductors and a capacitor between them which acts as a band stop filter at the second harmonic frequency.

47 Claims, 9 Drawing Figures

Patented Jan. 7, 1975

3,859,657

2 Sheets-Sheet 1

SECOND HARMONIC FILTER FOR HIGH FREQUENCY SOURCE

BACKGROUND OF THE INVENTION

To limit the operating bandwidth requirement of doppler radar intrusion alarm systems to prevent interference with other high frequency systems, it is desirable to limit the energy radiated at the second harmonic frequency to a maximum of 50 db below the energy radiated at the fundamental frequency of the transmitted signal. Since these intrusion alarms and the like are often produced in large quantities and made available at reasonably low cost to users, a filter for attenuating the energy at the second harmonic must be susceptible to production assembly in relatively large quantities and must be correspondingly low in cost. The present invention provides second harmonic filters which are effective to reduce the radiation of energy at the second harmonic to a maximum of 50 db below the radiation of energy at the fundamental frequency of the transmitted signal, are exceptionally straight forward in construction, are not unduly sensitive to manufacturing variations, are reliable in use, and are readily assembled with the associated parts of the doppler radar system. In accordance with this invention, a filter element is located proximate to the coupling port of a microwave transmitter cavity and constructed so that the transfer of fundamental frequency energy is substantially unattenuated while the transfer of second harmonic energy is attenuated. In a first embodiment, the filter includes a dielectric medium, preferably in sheet form, which bridges the coupling port and which supports a resonant half wavelength second harmonic stub formed of a conducting material in spaced relationship with the coupling port. In the fundamental frequency circuit, capacity tuning of the coupling port is obtained by a capacity between the cavity housing above the coupling port and the stub and a connected capacity between the stub and the cavity housing below the coupling port. The coupling port is physically undersize relative to its usual dimension for the fundamental frequency utilized so as to appear inductive at the fundamental frequency such that the capacity of the tuning stub is offset by the inductance of the coupling port to obtain optimum coupling of energy at the fundamental frequency through the coupling port. The stub is sized so as to not be independently resonant at the fundamental frequency. However, at the second harmonic frequency, the stub is of a predetermined length and size to provide inductive and capacitive values so as to become a resonant half wavelength stub performing the function of a stop-band filter for electromagnetic fields being coupled from the cavity through the coupling port. Preferably, the dielectric medium is a dielectric sheet which is sandwiched in the microwave structure and has deposited thereon a conducting film which has a width and length suitable for providing a resonant stub at the second harmonic frequency.

In a second embodiment, the filter includes a pair of opposed projections positioned mid-way of the coupling port and having predetermined opposed surface areas to form a pair of inductors and a capacitor which acts as a band stop filter at the second harmonic frequency. Preferably, the projections are an integral part of the cavity and are located within the coupling port. In this regard, the wall thickness at the coupling port and the dimension of the projections along the elongated axes of the port may be controlled to provide the appropriately sized opposed surface areas of the projections. Whereas a typical system without a second harmonic filter according to this invention will have second harmonic energy typically in the range of 15 db to 30 db below the energy at the fundamental frequency, the use of a filter according to the present invention has reduced the energy in the second harmonic to approximately 50 db below the energy at the fundamental frequency.

DETAILED DESCRIPTION OF THE PREFERRED EMBODIMENT

Figures 1, 2:
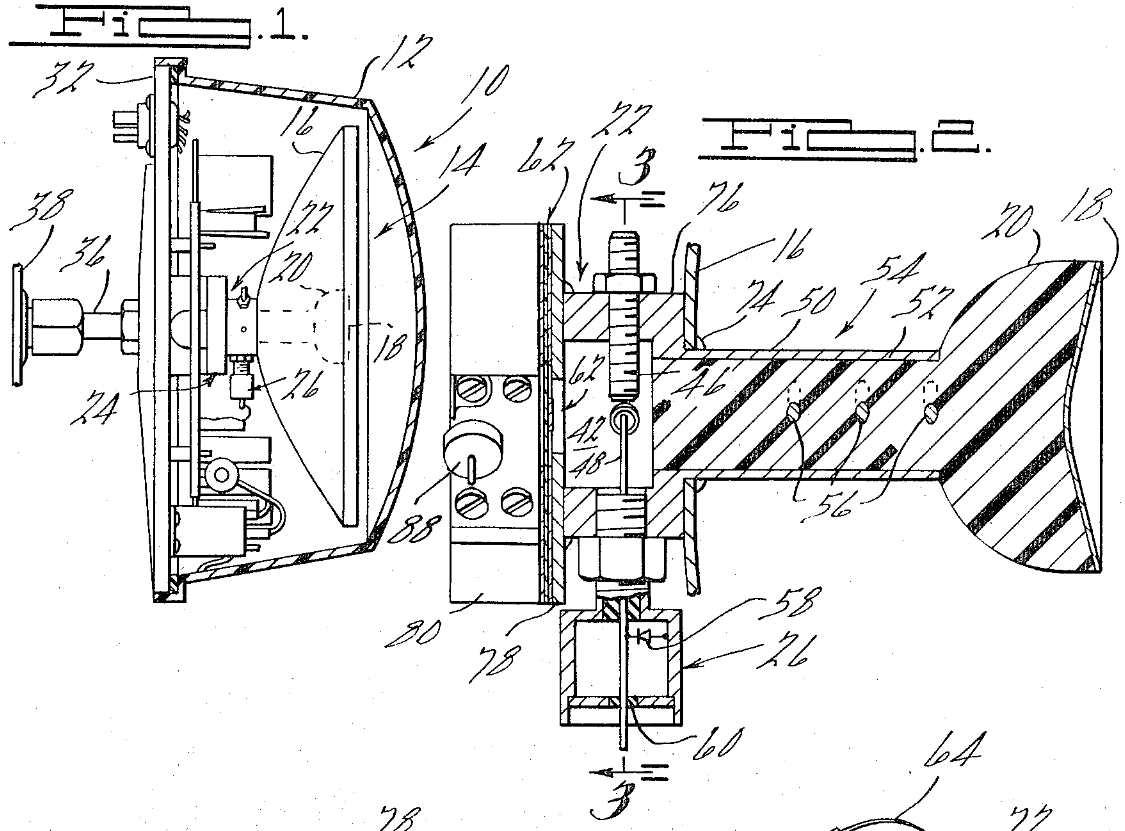
FIG. 1 is a side view, partially in elevation and partially in cross section, of an intrusion detection system incorporating a first embodiment of a filter in accordance with the present invention.
FIG. 2 is a side cross-sectional view of a mixer, receiver, and splash plate for the intrusion detection system of FIG. 1.

In FIG. 1, an intrusion detection system 10 is illustrated as including, in part, a radome 12, an antenna 14 which essentially comprises a parabolic dish 16, and a splash plate 18. The splash plate 18 is shown in exaggerated thickness in FIG. 1 for illustrative purposes. The splash plate 18 is fixedly supported with respect to the reflector 16 by high-density dielectric support member 20 as best seen in FIG. 2. The intrusion detection system 10 further comprises a mixer section 22, a transmitter section 24, and a receiver section 26. The intrusion detection system 10 is provided with a base plate 32 which is in sealing engagement with the radome 12. The intrusion detection system 10 may be adjustably mounted on a wall or other support by means of a pedestal 36 and a universally connected pedestal base 38.

Figure 3:
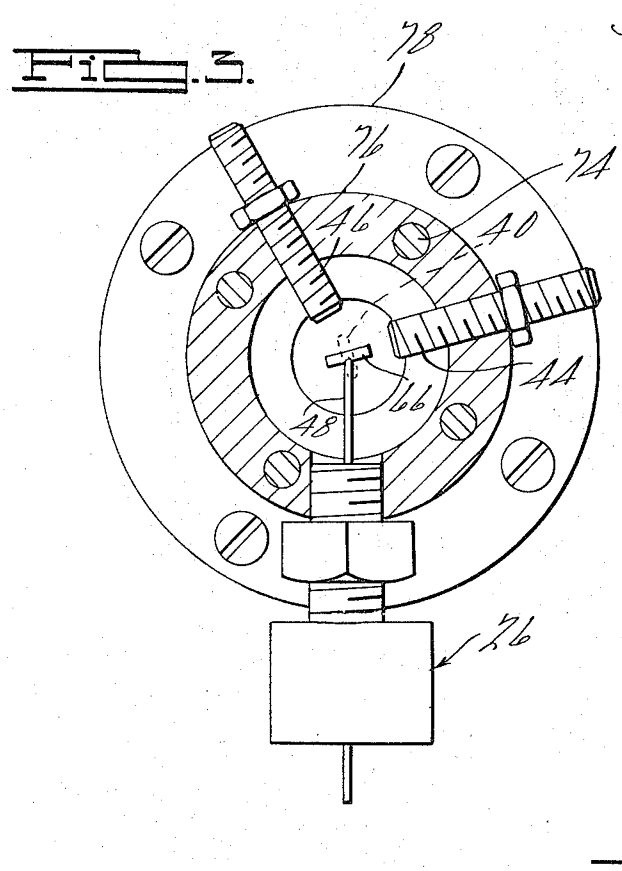
FIG. 3 is an end cross-sectional view of the mixer of the intrusion detection system of FIG. 1.
Figure 4:
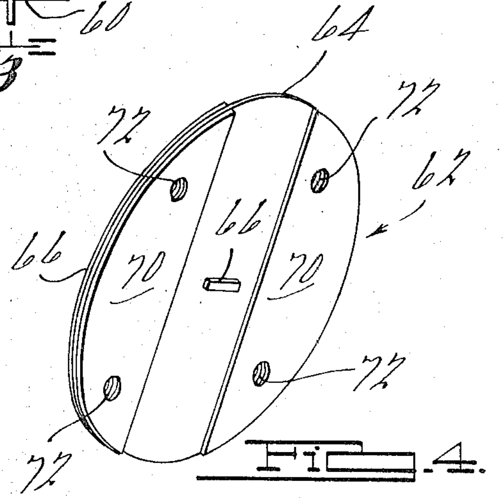
FIG. 4 is a perspective illustration of the first embodiment of a filter according to the present invention.
Figure 6:
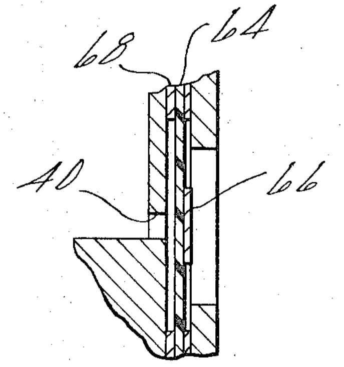
FIG. 6 is a detailed cross-sectional view of the filter and transmitter iris assembly of FIG. 5.

The microwave circuitry illustrated in FIG. 2 will be explained with additional reference to FIG. 3 which illustrates a front cross-sectional view of the mixer taken generally along the lines 3-3 of FIG. 2, FIG. 5, which is a cross-sectional view of the transmitter 24, and FIG. 6, which is an enlarged cross-sectional view of the coupling port and filter. Microwave energy is generated within the transmitter 24 and is radiated from the transmitter through a slot-type coupling port, iris or window 40, which provides plane polarized electromagnetic energy with the electric field of the energy being generally orthogonal to the elongated axis of the iris 40. The energy enters a mixing cavity 42 which has a pair of threaded adjustable tuning screws 44 and 46. A receiver probe 48 extends into the cavity 42 at a slight angle to the orthogonal axis of the electric field radiated from the iris 40. The inclination of the receiver probe 48 tends to skew the electric field with respect to the axis which is orthogonal to the iris 40. The presence of the tuning member 46 compensates for the effect of the skewed receiver probe 48 and the orientation of the electric field of the transmitter energy so that the electric field remains substantially aligned with an axis which is orthogonal to the iris 40. More particularly, the tuning probe 46 is aligned at the same angle with respect to the axis of the iris 40 as the probe 48 and is radially adjusted to have an equal and opposite effect on the electric field to balance the mixer cavity 42 so as to maintain the electric field orthogonal to the iris 40. The effect of the tuning probe 48 is further balanced by the radially adjustable tuning member 44 which is aligned parallel to the electric field. The tuning probe 48 further serves to match the transmitter 24 to the antenna and antenna feed structure.

The receiver probe 48 is skewed sufficiently with respect to the axis which is orthogonal to the electric field so as to extract a small amount of the outgoing microwave energy admitted from the iris 40. In the preferred embodiment, the receiver probe 48 is skewed at an angle of 15° with respect to the axis of the iris 40.

Outgoing microwave energy in the mixer cavity 42 is transmitted to the splash plate 18 through a circular wave guide 50. The circular wave guide 50 receives a cylindrical portion 52 of the splash plate support member 20 which contains a polarizer 54 comprising three pins 56 which are axially spaced apart somewhat less than one-fourth of a wavelength of the operating frequency and which are aligned at an angle of 45° with respect to the outgoing electric field. The pins 56 are centrally located with respect to the cylindrical portion 52 of the splash plate support member 20 and have a length which is approximately one half of the diameter of the cylindrical portion 52. The number of pins can be increased to increase the bandwidth of the polarizer 54, however, three pins have been found to provide a suitable bandwidth. The polarizer 54 converts the plane polarized wave from the iris 40 to a circularly polarized wave comprising two components having orthogonal electric fields, with one component lagging the other component in phase by 90°. A substantial portion of the circularly polarized wave impinges on the splash plate 18 and is reflected toward the parabolic reflector 16. It should be noted that the support member 20 has a concave face so that the splash plate 18 assumes a concave configuration which is established in accordance with the focal point of the parabolic dish 16.

Energy reflected from an object such as an intruder is shifted in phase by 180° such that the component of the outgoing circularly polarized wave which was leading in phase by 90° is consequently lagging in phase by 90°. When the reflected portion reenters the polarizer 54 by reflection from the reflector 16 onto the splash plate 18, the circularly polarized wave is converted to a plane polarized wave having an electric field which is orthogonal to the electric field of the outgoing wave. Thus, the orthogonal relationship between the outgoing and reflected wave is due to the phase reversal which occurs on reflection of the wave from an object. Consequently, the electric field of the incoming wave is substantially aligned with the receiver probe 48 such that a major portion of the receiver energy is coupled to the probe 48. Therefore, it can be seen then that the receiver probe 48 receives a major portion of the incoming reflected wave and a small portion of the outgoing wave so that a mixing of the two waves occurs at the receiver probe 48.

When transmitted energy is reflected by a moving object, the frequency of the received energy is shifted by an amount proportional to the speed of the object. The signal resulting from the mixing of the reflected signal with the small portion of the transmitted signal has a low frequency component representative of the frequency shift which is detected at a diode 58 of the receiver 26 to provide a low frequency signal representative of the difference in the frequencies of the transmitted and received waves. For example, the diode 58 may be a Schottky barrier diode. The bandwidth of the receiver is designed to reject signals which are outside of the frequency range of interest, i.e., signals which are above or below the frequency range within which doppler signals are found which are typically caused by intruders. For example, signals that are above the bandwidth can be caused by outside interference while signals below the bandwidth may be caused by low rate power shifts. A dielectric member 60 is interposed between the receiver probe 48 and the receiver housing 26 to provide an AC block whereby only the low frequency doppler signals will appear at the exposed end portion of the receiver probe 48.

The intrusion detection system 10 of this invention is described in greater detail relative to the antenna 14, mixer 22, transmitter 24, receiver 26, and a signal processing circuit, not shown herein, in the application of Cheal, et al, for "Intrusion Detection System," Ser. No. 237,745, filed Mar. 24, 1972, and the application of Cheal, et al, for "Intrusion Detection System," Ser. No. 242,610, filed Apr. 10, 1972, each of which is assigned to the assignee of the present invention. The teachings of each of the aforementioned applications are incorporated herein by reference thereto.

The intrusion detection system 10 further includes a second harmonic stop band filter assembly 62 which essentially comprises a sheet 64 of dielectric medium and an elongated, half wavelength stub 66 which is secured to the dielectric sheet 64. The half wavelength stub 66 is preferably deposited on the dielectric 64 by a photodeposition method. More particularly, a copper foil is secured to each side of a dielectric medium, such as mylar, by an adhesive or other means of attachment. The portions of the copper foil which are to be removed to form the half wavelength stub are removed by a suitable chemical etching process. As can be best seen in FIG. 5, the dielectric sheet 64 bridges the iris 40 and supports the tuning stub 66 perpendicularly with respect to the iris 40 and spaced from the iris 40 so as to establish a capacitance between the cavity housing portion above the iris 40 and the stub 66 and the cavity housing portion below the iris 40 and the stub 66. The dielectric member 64 is shown slightly spaced from the iris 40 by virtue of the interposition of an enlarged foil portion 68 used essentially for stiffening purposes on one side of the dielectric sheet 64. A similar stiffening foil portion 70 appears on the opposite side of the dielectric sheet 64. The mylar sheet 64 and the reinforcement foils 66 and 70 have four holes 72 for receiving bolts 74. The bolts 74 extend through the dish 16, a housing 76 for the mixer section 22, a clamping plate 78, and the filter assembly 62 and are threadably engaged with a housing 80 of the transmitter 24. Accordingly, the filter assembly 62 is held in clamping engagement between the clamping plate 78 and the housing 80 of the transmitter section 24.

Essentially, the tuning stub 66 is located in physical proximity with the iris 40 such that the transfer of fundamental frequency energy is unattenuated while the transfer of second harmonic energy is attenuated. To understand the operation of the filter, the coupling between the transmitter section 24 and the mixer cavity 22 at the iris 40 must first be considered. With reference to FIG. 5, the transmitter section 24 has a housing 80 which receives an axially adjustable tuning stub 82 and an active element 84 which may be an IMPATT diode or a Gunn effect device. The active device 84 is biased by a conductor 86 which extends through a feed through capacitor at 88 which is generally formed by the interposition of a dielectric median between the conductor 86 and the housing 80 for the transmitter section 24. The conductor 86 provides a distributed inductance at its length which is within the transmitter cavity. Electromagnetic coupling to the cavity is established through a distributed capacitance between the active device 84 and the tuning stub 82 with some added coupling effects being achieved by the distributed inductance of the biasing conductor 86. An active circuit of the type described above coupled to a waveguide transmission line such as illustrated herein through an unaltered iris 40 will have a second harmonic content typically in the range of 15 db to 30 db below the fundamental frequency power level, depending upon the various bias and drive levels, and the various possible second harmonic loading effects of the distributed line 86. Circulating current around the portion of the tuning stub 82 within the cavity is coupled to the mixing section 22 and waveguide 50 by the current port 40 which establishes a voltage vector field in the waveguide for transmission of an electromagnetic field through the waveguide. The desired degree of coupling between the transmitter cavity and the mixer section 22 is obtained by adjustment of the length of the port 40 in accordance with the fundamental frequency. More specifically, the port is formed physically undersize so as to appear inductive at the fundamental frequency so that optimum coupling is obtained when the filter is used since the capacitive tuning across the port 40, provided by the filter stub 66, compensates for the inductance resulting from the undersize port. The undercut is calculated in accordance with the length and width of the stub, i.e., the area of the stub presented to the iris. The stub is somewhat less than one-half wavelength in length at the frequency of the second harmonic since the wavelength is somewhat shorter in the dielectric than in free space. At the fundamental frequency, capacity tuning of the port 40 is established by the capacity between the section of the transmitter housing 80 above the iris 40 and the upper portion of the tuning stub 66 and the connected capacity between the lower portion of the tuning stub 66 and the portion of the transmitter housing 80 below the iris 40. The tuning stub 66 is not independently resonant at the fundamental frequency. However, at the second harmonic frequency, the tuning stub 66 becomes a resonant half wavelength stub performing the function of a stop-band filter for electromagnetic fields being coupled from the transmitter cavity to the mixer section 22 and the waveguide 50. More particularly, the stub forms capacitors and an inductor which is effectively in series with the inductance of the iris so that the circuit formed by the iris inductance in the capacitance of the stub resonates at the second harmonic. As a result, the second harmonics are attenuated at this resonant circuit so as to reduce the second harmonic energy to at least 50 db below the fundamental energy in a representative embodiment.

Figures 5, 7, 8, 9:
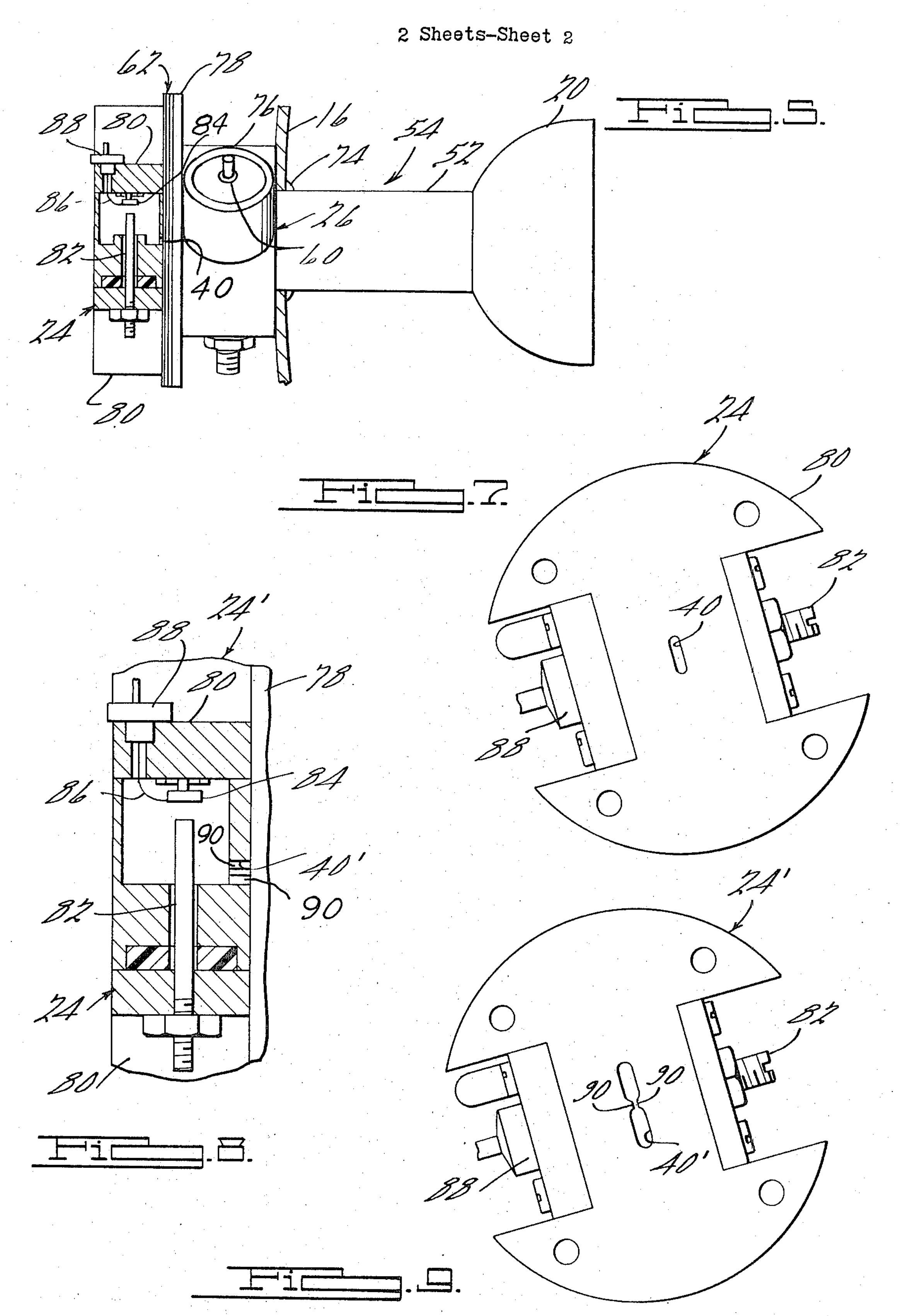
FIG. 5 is a side cross-sectional view of the transmitter for the intrusion detection system of FIG. 1.
FIG. 7 is an end view of the transmitter of the intrusion detection system of FIG. 1.
FIG. 8 is a side cross-sectional view of the transmitter of an intrusion detection system having a second embodiment of a filter in accordance with the present invention.
FIG. 9 is an end view of the transmitter of FIG. 8.

With reference to FIGS. 8 and 9, a second embodiment of a second harmonic filter of the present invention will be considered. In FIGS. 8 and 9, a transmitter 24' having a port 40' which differs from the port 40 of FIGS. 1 through 7 in that it is provided with a pair of projections 90 mid-way along the transverse dimension of the port 40', i.e., mid-way between its lateral ends. The projections 90 are an integral part of the housing 80 of the transmitter section 24' and is located within the port 40'. The projections 90 provide opposed planar surfaces which form a capacitor by virtue of the separation and area of the opposed surfaces. In this regard, it is often an advantage to use a somewhat thicker cavity wall at the port 40' to provide a suitable area for the capacitor without unduly increasing the lateral width of the projections 90. The projections 90, by virtue of their length, are inductors which form a resonant circuit with the capacitor. The opposed surfaces of the projections 90 are sized and spaced so as to provide a value of capacitance and inductance which will cause the projections 90 to act as a band stop filter at the second harmonic frequency so that the energy at the second harmonic frequency is substantially attenuated.

It should be noted that once the projections 90 and the port 40' are machined, no further assembly steps are required to provide the harmonic filter, and consequently, errors in assembly are avoided.

In view of the above detailed description of the preferred embodiments of this invention, it will be appreciated that the second harmonic filters of this invention are relatively straightforward in construction and can be easily assembled with the microwave circuit of the doppler radar system shown or with other like systems using a high frequency source. It is relatively inexpensive to fabricate, and therefore, is readily adaptable to incorporation in relatively low-cost units. In view of these advantages, the present invention is believed to be a significant advance in the art.

It will be appreciated by those skilled in the art that the preferred embodiment of the invention disclosed herein is susceptible to modification, variation and change without departing from the proper scope of fair meaning of the subjoined claims.

What is claimed is:

1. A high frequency system comprising:

means for generating electromagnetic energy at a fundamental frequency and at the second harmonic frequency of the fundamental frequency including a housing having a port which is substantially dimensioned for transfer of said electromagnetic energy at the fundamental frequency therethrough but has at least one dimension which is a predetermined degree different than the optimum dimension for transfer of said electromagnetic energy at the fundamental frequency therethrough so that said port has a predetermined impedance value at the fundamental frequency; and filter means for attenuating said energy at the second harmonic frequency of said fundamental frequency including member means proximate to and extending transversely of said port being dimensioned to provide a value of inductance and capacitance for attenuating said energy at the second harmonic frequency, one of said values of inductance and capacitance of each member means being selected at least in part to offset said predetermined impedance value of said port at the fundamental frequency.

2. A high frequency system according to claim 1 wherein said member means is spaced from said port a predetermined distance and is dimensioned so as to form a resonant circuit at said second harmonic frequency for attenuating said energy at said second harmonic frequency.

3. A high frequency system according to claim 2 further including a dielectric member interposed between said filter means member and said port for supporting said filter means member in spaced relationship to said port and said housing.

4. A high frequency system according to claim 3 wherein said dielectric member is a flat sheet.

5. A high frequency system according to claim 4 wherein said filter means member comprises a metallic material disposed on said flat sheet.

6. A high frequency system according to claim 5 wherein said sheet has a predetermined thickness for spacing said filter means member said predetermined distance.

7. A high frequency system according to claim 6 wherein said filter means member has a predetermined area confronting said port so that said predetermined distance establishes resonance at the second harmonic frequency to attenuate said second harmonic energy.

8. A high frequency system according to claim 1 wherein said member means comprises a projection from said housing.

9. A high frequency system according to claim 8 wherein said projection has a surface capacitively coupled to said housing to provide said capacitance value and a projecting dimension to provide said inductance value.

10. A high frequency system according to claim 9 wherein said projection is disposed at least partly within said port.

11. A high frequency system according to claim 10 wherein said projection is disposed wholly within said port.

12. A high frequency system according to claim 8 wherein said member means comprises a second projection from said housing opposing said first mentioned projection.

13. A high frequency system according to claim 12 wherein each of said projections has a surface confronting the surface of the other to provide said capacitance value and each of said projections has projecting dimensions to provide said inductance value.

14. A high frequency system according to claim 13 wherein said projections are disposed at least partly within said port.

15. A high frequency system according to claim 14 wherein said projections are disposed wholly within said port.

16. A doppler intrusion alarm system comprising:

means for generating electromagnetic energy at a fundamental frequency and at the second harmonic frequency of the fundamental frequency including a housing having a port which is substantially dimensioned for transfer of said electromagnetic energy at the fundamental frequency therethrough but has at least one dimension which is a predetermined degree different than the optimum dimension for transfer of said electromagnetic energy at the fundamental frequency therethrough so that said port has a predetermined impedance value at the fundamental frequency;

filter means for attenuating said energy at the second harmonic frequency of said fundamental frequency including member means proximate to and extending transversely of said port being dimensioned to provide a value of inductance and capacitance for attenuating said energy at the second harmonic frequency, one of said values of inductance and capacitance of each member means being selected at least in part to offset said predetermined impedance value of said port at the fundamental frequency;

means for radiating said generated electromagnetic energy and for receiving a reflected portion of said radiated energy; and receiver means for detecting a frequency difference between said generated energy and said reflected portion of said generated energy whereby the movement of an intruder may be detected and an alarm may be provided.

17. A doppler intrusion alarm system according to claim 16 wherein said member means is spaced from said port a predetermined distance and is dimensioned so as to form a resonant circuit at said second harmonic frequency for attenuating said energy at said second harmonic frequency.

18. A doppler intrusion alarm system according to claim 17 further including a dielectric member interposed between said filter means member and said port for supporting said filter means member in spaced relationship to said port and said housing.

19. A doppler intrusion alarm system according to claim 18 wherein said dielectric member is a flat sheet.

20. A doppler intrusion alarm system according to claim 19 wherein said filter means member comprises a metallic material disposed on said flat sheet.

21. A doppler intrusion alarm system according to claim 20 wherein said sheet has a predetermined thickness for spacing said filter means member said predetermined distance.

22. A doppler intrusion alarm system according to claim 21 wherein said filter means member has a predetermined area confronting said port so that said predetermined distance establishes resonance at the second harmonic frequency to attenuate said second harmonic energy.

23. A doppler intrusion alarm system according to claim 16 wherein said filter means member means comprises a projection from said housing.

24. A doppler intrusion alarm system according to claim 23 wherein said projection has a surface capacitively coupled to said housing to provide said capacitance value and a projecting dimension to provide said inductance value.

25. A doppler intrusion alarm system according to claim 24 wherein said projection is disposed at least partly within said port.

26. A doppler intrusion alarm system according to claim 25 wherein said projection is disposed wholly within said port.

27. A doppler intrusion alarm system according to claim 23 wherein said member means includes a second projection from said housing opposing said first mentioned projection.

28. A doppler intrusion alarm system according to claim 27 wherein each of said projections has a surface confronting the surface of the other to provide said capacitance value and each of said projections has projecting dimensions to provide said inductance value.

29. A doppler intrusion alarm system according to claim 28 wherein said projections are disposed at least partly within said port.

30. A doppler intrusion alarm system according to claim 29 wherein said projections are disposed wholly within said port.

31. A high frequency system according to claim 1 wherein said member means is disposed at least partly within said port.

32. A high frequency system according to claim 1 wherein said member means is disposed wholly within said port.

33. A high frequency system according to claim 1 wherein said member means is disposed wholly outside of said port.

34. A doppler intrusion alarm system according to claim 16 wherein said member means is disposed at least partly within said port.

35. A doppler intrusion alarm system according to claim 16 wherein said member means is disposed wholly within said port.

36. A doppler intrusion alarm system according to claim 16 wherein said member means is disposed wholly outside of said port.

37. A doppler intrusion alarm system according to claim 16 wherein said port has at least one dimension which is a predetermined degree lesser than the optimum dimension for transfer of said energy at the fundamental frequency therethrough so that said port has an inductance value at the fundamental frequency, and wherein said capacitance value of said member means is selected at least in part to offset said inductance value of said port at the fundamental frequency.

38. A high frequendy system according to claim 1 further including a dielectric member interposed between said filter means member and said port for supporting said filter means member in spaced relationship to said port and said housing.

39. A high frequency system according to claim 38 wherein said dielectric member is a flat sheet.

40. A high frequency system according to claim 39 wherein said filter means member comprises a metallic material disposed on said flat sheet.

41. A high frequency system according to claim 40 wherein said sheet has a predetermined thickness for spacing said filter means member said predetermined distance.

42. A high frequency system according to claim 41 wherein said filter means member has a predetermined area confronting said port so that said predetermined distance establishes resonance at the second harmonic frequency to attenuate said energy at the second harmonic.

43. A high frequency system comprising:

means for generating electromagnetic energy at a fundamental frequency and at the second harmonic frequency of the fundamental frequency including a housing having a port for transfer of said electromagnetic energy at the fundamental frequency therethrough; and filter means for attenuating said energy at the second harmonic frequency of said fundamental frequency including first and second opposed projections from said housing proximate to and extending transversely of said port being dimensioned to provide a value of inductance and capacitance for attenuating said energy at the second harmonic frequency.

44. A high frequency system according to claim 43 wherein each of said projections has a surface confronting the surface of the other to provide said capacitance value and each of said projections has projecting dimensions to provide said inductance value.

45. A high frequency system according to claim 43 wherein said projections are disposed at least partly within said port.

46. A high frequency system according to claim 43 wherein said projections are disposed wholly within said port.

47. A high frequency system according to claim 43 wherein said projections are disposed wholly outside of said port.

* * * * *